United States Patent
Kosakai et al.

(10) Patent No.: US 10,622,239 B2
(45) Date of Patent: Apr. 14, 2020

(54) ELECTROSTATIC CHUCK DEVICE

(71) Applicant: SUMITOMO OSAKA CEMENT CO., LTD., Tokyo (JP)

(72) Inventors: Mamoru Kosakai, Tokyo (JP); Shinichi Maeta, Tokyo (JP); Keisuke Maeda, Tokyo (JP)

(73) Assignee: SUMITOMO OSAKA CEMENT CO., LTD., Tokyo (JP)

(*) Notice: Subject to any disclaimer, the term of this patent is extended or adjusted under 35 U.S.C. 154(b) by 295 days.

(21) Appl. No.: 15/562,850

(22) PCT Filed: Feb. 25, 2016

(86) PCT No.: PCT/JP2016/055608
§ 371 (c)(1),
(2) Date: Sep. 28, 2017

(87) PCT Pub. No.: WO2016/158110
PCT Pub. Date: Oct. 6, 2016

(65) Prior Publication Data
US 2018/0108555 A1    Apr. 19, 2018

(30) Foreign Application Priority Data

Mar. 31, 2015 (JP) ................. 2015-070497
Mar. 31, 2015 (JP) ................. 2015-072022

(51) Int. Cl.
*H01T 23/00*    (2006.01)
*H01L 21/683*   (2006.01)
(Continued)

(52) U.S. Cl.
CPC ...... *H01L 21/6833* (2013.01); *H01L 21/6831* (2013.01); *H01L 21/6875* (2013.01); *H01L 21/68757* (2013.01); *H01L 21/67103* (2013.01)

(58) Field of Classification Search
None
See application file for complete search history.

(56) References Cited

U.S. PATENT DOCUMENTS

| 9,343,346 B2* | 5/2016 | Kosakai | H01L 21/67103 |
| 9,837,296 B2* | 12/2017 | Maeta | H01L 21/67248 |
| 10,256,131 B2* | 4/2019 | Kosakai | B23Q 3/15 |

FOREIGN PATENT DOCUMENTS

| JP | H07-335732 A | 12/1995 |
| JP | 2000-114358 A | 4/2000 |

(Continued)

OTHER PUBLICATIONS

International Search Report for PCT/JP2016/055608 (dated May 10, 2016).

(Continued)

*Primary Examiner* — Stephen W Jackson
(74) *Attorney, Agent, or Firm* — Merchant & Gould P.C.

(57) ABSTRACT

An electrostatic chuck device includes: a placing plate having a placement surface on which a plate-like sample is placed on one side thereof; an electrostatic attraction electrode provided on the other side of the first ceramic plate; and a first organic insulating layer provided between the first ceramic plate and the electrostatic attraction electrode. The electrostatic chuck device further has a supporting plate provided between the first organic insulating layer and the electrostatic attraction electrode.

24 Claims, 6 Drawing Sheets

(51) Int. Cl.
*H01L 21/687* (2006.01)
*H01L 21/67* (2006.01)

(56) References Cited

FOREIGN PATENT DOCUMENTS

| | | |
|---|---|---|
| JP | 2004-079588 A | 3/2004 |
| JP | 2011-077303 A | 4/2011 |
| JP | 2011-151336 A | 8/2011 |
| WO | 2008/053934 A1 | 5/2008 |

OTHER PUBLICATIONS

Office Action for Japanese Patent Application No. 2016-514771, dated Sep. 17, 2019.

* cited by examiner

ELECTROSTATIC CHUCK DEVICE

TECHNICAL FIELD

The present invention relates to an electrostatic chuck device.

This application is a National Stage Application under 35 U.S.C. § 371 of International Application No. PCT/JP2016/055608 filed Feb. 25, 2016, which claims the benefit of priority to Japanese Patent Application No. 2015-070497 filed on Mar. 31, 2015 and Japanese Patent Application No. 2015-072022 filed on Mar. 31, 2015, the disclosures of all of which are hereby incorporated by reference in their entireties. The International Application was published in Japanese on Oct. 6, 2016 as WO 2016/158110.

BACKGROUND

In the past, in a semiconductor manufacturing apparatus using plasma, such as a plasma etching apparatus or a plasma CVD apparatus, as a device for easily mounting and fixing a plate-like sample such as a wafer or a glass substrate onto a sample stage, an electrostatic chuck device has been used. As the electrostatic chuck device, an electrostatic chuck device having a configuration having a ceramic plate having one main surface serving as a placement surface on which a plate-like sample is placed, and an electrostatic attraction electrode provided on the side of the surface on the other side of the ceramic plate is known (refer to, for example, Patent Literature No. 1).

Citation List

Patent Literature

[Patent Literature No. 1] Japanese Laid-open Patent Publication No. 2011-77303

SUMMARY OF INVENTION

Technical Problem

The electrostatic chuck device is exposed to high-temperature plasma environment during the use, and therefore, durability against plasma (plasma resistance) is required. Further, in recent years, a plate-like sample, which is an object to be processed in a plasma process, has been increased in size, and therefore, the electrostatic chuck device is required to have a strong attraction force with respect to the plate-like sample.

In an electrostatic chuck using a ceramic plate as a dielectric layer, in a case of attempting to realize a strong attraction force with respect to the plate-like sample, it is conceivable to increase the Coulomb force by shortening the distance from the surface of the electrostatic attraction electrode to the placement surface by making the ceramic plate thin. However, the electrostatic chuck device is exposed to plasma environment during the use, and therefore, if the ceramic plate is made to be thin, the ceramic plate is liable to be damaged by plasma, and thus there is a concern that a product lifetime may be shortened. Further, if the ceramic plate is made to be thin, the ceramic plate is subjected to dielectric breakdown, and thus there is a concern that pinholes may be generated.

In a case of attempting to realize a strong attraction force with respect to the plate-like sample by another method, it is conceivable to increase the Coulomb force by applying a high voltage to the electrostatic attraction electrode. However, even in that case, voltage exceeding the withstand voltage of the ceramic plate cannot be applied to the electrostatic attraction electrode, and thus an electrostatic attraction force which is obtained has an upper limit.

For this reason, an electrostatic chuck device which has a higher withstand voltage than in the related art, and thereby enabling application of a higher voltage to the electrostatic attraction electrode to enable fixing of the plate-like sample with a stronger attraction force than in devices of the related art has been required.

The present invention has been made in view of such circumstances and has an object to provide a novel electrostatic chuck device having a high withstand voltage.

Solution to Problem

In order to solve the above problem, according to an aspect of the present invention, there is provided an electrostatic chuck device including: a first ceramic plate having a placement surface on which a plate-like sample is placed on one side thereof; an electrostatic attraction electrode provided on the other side of the first ceramic plate; and a first organic insulating layer provided between the first ceramic plate and the electrostatic attraction electrode.

In the aspect of the present invention, the electrostatic chuck device may further include: a temperature regulating base that cools the first ceramic plate and arranged on the electrostatic attraction electrode on the opposite side from the first ceramic plate; and a second organic insulating layer provided between the temperature regulating base and the electrostatic attraction electrode.

In the aspect of the present invention, the first ceramic plate may have a first embankment surrounding the other side along the periphery of the other side, and the first organic insulating layer and the electrostatic attraction electrode may engage with an indentation formed by the first embankment and the other side.

In the aspect of the present invention, the electrostatic chuck device may further include: a temperature regulating base that cools the first ceramic plate and arranged on the electrostatic attraction electrode on the opposite side from the first ceramic plate, and a second organic insulating layer provided between the temperature regulating base and the electrostatic attraction electrode, the first embankment may be provided in contact with the second organic insulating layer, and the first organic insulating layer and the electrostatic attraction electrode maybe sealed in a space surrounded by the first ceramic plate and the second organic insulating layer.

In the aspect of the present invention, the first embankment may be provided in contact with the second organic insulating layer on the side of the first ceramic plate.

In the aspect of the present invention, the second organic insulating layer may engage with the indentation.

In the aspect of the present invention, the electrostatic chuck device may further include: an adhesive layer that adheres an electrostatic chuck member, the first organic insulating layer and the electrostatic attraction electrode may be sealed in the space surrounded by the first ceramic plate and the second organic insulating layer, to the temperature regulating base.

In the aspect of the present invention, the electrostatic attraction electrode and the first organic insulating layer may be formed to be smaller than the temperature regulating base when viewed from above, and the first embankment may have an outer peripheral portion that covers the surface of the temperature regulating base and provided projecting outward from the outside surface.

In the aspect of the present invention, a through hole may be provided that passes through the entire electrostatic chuck device in the direction of thickness, the first ceramic plate may have a first through hole that passes therethrough in the direction of thickness, the electrostatic attraction electrode maybe formed while avoiding the through hole, the first organic insulating layer may have a second through hole that passes therethrough in the direction of thickness and communicates with the first through hole, and the first ceramic plate may further have a second embankment that surrounds the periphery of the first through hole and is inserted into the second through hole.

In the aspect of the present invention, a through hole may be provided that passes through the entire electrostatic chuck device in the direction of thickness, the first ceramic plate may have a first through hole that passes therethrough in the direction of thickness, the electrostatic attraction electrode maybe formed while avoiding the through hole, the first organic insulating layer may have a second through hole that passes therethrough in the direction of thickness and communicates with the first through hole, and a third organic insulating layer may be provided between the electrostatic attraction electrode and the through hole that surrounds the through hole.

In the aspect of the present invention, the first organic insulating layer may have a withstand voltage of 5 kV or more.

In the aspect of the present invention, the electrostatic attraction electrode may be smaller than the first organic insulating layer when viewed from above.

In the aspect of the present invention, the first organic insulating layer may be controlled so that the heat transfer rate between the first ceramic plate and the electrostatic attraction electrode is greater than 750 W/m²K.

In the aspect of the present invention, the electrostatic chuck device may further include: a second ceramic plate provided between the first organic insulating layer and the electrostatic attraction electrode or on the electrostatic attraction electrode on the opposite side from the first organic insulating layer.

In the aspect of the present invention, the electrostatic chuck device may further include: a temperature regulating based that cools the first ceramic plate and arranged on the electrostatic attraction electrode on the opposite side from the first ceramic plate, and a second organic insulating layer provided between the temperature regulating base and the electrostatic attraction electrode.

In the aspect of the present invention, the first ceramic plate may have a first embankment that surrounds the other side along the periphery of the other side, and the first organic insulating layer, the second ceramic plate and the electrostatic attraction electrode may engage with an indentation formed by the first embankment and the other side.

In the aspect of the present invention, the second ceramic plate may be provided between the first organic insulating layer and the electrostatic attraction electrode.

In the aspect of the present invention, the second ceramic plate maybe provided on the electrostatic attraction electrode on the opposite side from the first organic insulating layer.

In the aspect of the present invention, the first organic insulating layer may be sealed in a space surrounded by the first ceramic plate and the second ceramic plate.

In the aspect of the present invention, a through hole may be provided that passes through the entire electrostatic chuck device in the direction of thickness, the first ceramic plate may have a first through hole that passes therethrough in the direction of thickness, the electrostatic attraction electrode maybe formed while avoiding the through hole, the first organic insulating layer may have a second through hole that passes therethrough in the direction of thickness and communicates with the first through hole, the second ceramic plate may have a third through hole that passes therethrough in the direction of thickness and communicates with the first through hole and the second through hole, and the first ceramic plate may further have a second embankment that surrounds the periphery of the first through hole and is inserted into the second through hole and the third through hole.

In the aspect of the present invention, the first organic insulating layer may have a withstand voltage of 5 kV or more.

In the aspect of the present invention, the electrostatic attraction electrode may be smaller than the first organic insulating layer when viewed from above.

Advantageous Effects of Invention

According to the present invention, it is possible to provide a novel electrostatic chuck device having a high withstand voltage.

DESCRIPTION OF EMBODIMENTS

[First Embodiment]

Hereinafter, an electrostatic chuck device 1A according to a first embodiment of the present invention will be described with reference to FIG. 1. In all of the following drawings, in order to make the drawings easier to see, dimensions, ratios, or the like of the respective constituent elements is appropriately changed.

Figure 1:
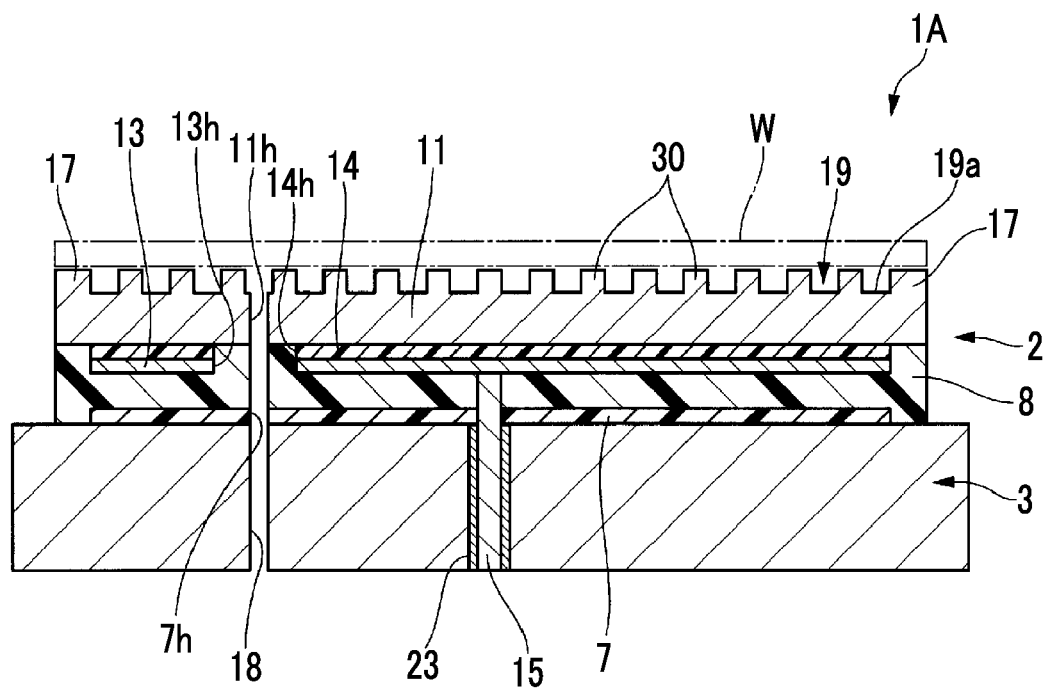
FIG. 1 is a cross-sectional view of an electrostatic chuck device according to a first embodiment of the present invention.

FIG. 1 is a cross-sectional view of the electrostatic chuck device 1A. As shown in the drawing, the electrostatic chuck device 1A has an electrostatic chuck section 2 having an upper surface serving as a placement surface 19 on which a plate-like sample W such as a semiconductor wafer is placed, a temperature regulating base 3 which controls the temperature of the electrostatic chuck section 2 to a desired temperature, and an adhesive layer 8 which bonds and integrates the electrostatic chuck section 2 and the temperature regulating base 3 together.

In the following description, there is a case where the relative positions of the respective configurations are indicated with the placement surface 19 side as an "upper side" and the temperature regulating base 3 side as a "lower side".

The electrostatic chuck section 2 has a placing plate (a first ceramic plate) 11 having an upper surface serving as the placement surface 19 on which the plate-like sample W such as a semiconductor wafer is placed, an electrostatic attraction electrode 13 provided on the surface (the surface on the other side) on the side opposite to the placement surface 19 of the placing plate 11, and a first organic insulating layer 14 provided between the placing plate 11 and the electrostatic attraction electrode 13.

As shown in the drawing, a plurality of protrusion portions 30 each having a diameter smaller than the thickness of the plate-like sample W are formed on the placement surface 19 of the electrostatic chuck section 2. The electrostatic chuck device 1A has a configuration in which the plurality of protrusion portions 30 support the plate-like sample W.

Further, a peripheral wall 17 is formed at the periphery of the placement surface 19. The peripheral wall 17 is formed at the same height as the protrusion portions 30 and supports the plate-like sample W together with the protrusion portions 30.

The placing plate 11 is made of an insulating ceramic sintered body having mechanical strength and having durability against corrosive gas and plasma thereof, such as an aluminum oxide-silicon carbide ($Al_2P_3$—SiC) composite sintered body, an aluminum oxide ($Al_2O_3$) sintered body, an aluminum nitride (AlN) sintered body, or an yttrium oxide ($Y_2O_3$) sintered body.

The average particle diameter of ceramic particles in the ceramic sintered body is preferably 10 μm or less and more preferably 2 μm or less. Sandblasting is performed in a process of forming the protrusion portions 30 which are provided on the placement surface 19 of the electrostatic chuck section 2. The sandblasting process is a process of damaging and excavating the surface of the placement surface 19, and therefore, cracks remain inside of the protrusion portions 30. The cracks are forcibly removed in advance by buffing which is performed after the sandblasting process.

The cracks are formed at grain boundaries of the ceramic particles in the ceramic sintered body. Therefore, in a case where the particle diameter of the ceramic particle is large, corners are greatly removed along the grain boundaries by undergoing the buffing. The larger the particle diameter of the ceramic particle is, the more rounded the shape of the protrusion portion 30 is. As will be described later, since it is preferable that the protrusion portion 30 of this embodiment does not have a change in cross-sectional area in a height direction, it is preferable that the protrusion portion 30 is not rounded. By setting the average particle diameter of the ceramic particles to be 10 μm or less (more preferably, 2 μm or less), it is possible to form the protrusion portion 30, in which a change in cross-sectional area in the height direction is suppressed, on the placement surface 19.

The thickness from the upper surface of the placing plate 11 to the lower surface of the electrostatic attraction electrode 13, that is, the thickness of the electrostatic chuck section 2 is preferably 0.5 mm or more and 5.0 mm or less. If the thickness of the electrostatic chuck section 2 is less than 0.5 mm, it is not possible to secure the mechanical strength of the electrostatic chuck section 2. On the other hand, if the thickness of the electrostatic chuck section 2 exceeds 5.0 mm, the heat capacity of the electrostatic chuck section 2 becomes too large, and thus the thermal responsiveness of the plate-like sample W which is placed thereon deteriorates. Further, according to an electrostatic chuck device, there is a case of adopting a configuration in which a heater is provided between the electrostatic attraction electrode 13 and the temperature regulating base 3 and a temperature distribution is formed on the plate-like sample W by the heater. In such an electrostatic chuck device, if the thickness of the electrostatic chuck section 2 exceeds 5.0 mm, due to an increase in thermal conduction in a lateral direction of the electrostatic chuck section 2, it becomes difficult to maintain the in-plane temperature of the plate-like sample W at a desired temperature pattern.

In particular, the thickness of the placing plate 11 is preferably 0.3 mm or more and 1.0 mm or less. If the thickness of the placing plate 11 is less than 0.3 mm, the insulation of the placing plate 11 is broken by the voltage applied to the electrostatic attraction electrode 13, and thus there is a concern that electric discharge may occur. Further, if the thickness of the placing plate 11 is less than 0.3 mm, breakage and cracking easily occur during processing. On the other hand, if the thickness of the placing plate 11 exceeds 1.0 mm, it becomes difficult for the plate-like sample W to be sufficiently attracted and fixed with a desired strength.

The first organic insulating layer 14 is a resin layer having insulation properties and voltage resistance. The first organic insulating layer 14 is preferably formed by bonding a film-shaped or sheet-shaped forming material. The first organic insulating layer 14 is bonded to the lower surface of the placing plate 11 through an adhesive layer (not shown). With respect to s high voltage which is applied to the electrostatic attraction electrode 13, the placing plate 11 and the first organic insulating layer 14 cooperate with each other to exhibit withstand voltage (dielectric breakdown voltage, (unit: kV)) at which dielectric breakdown does not occur.

The thickness of the first organic insulating layer 14 is preferably 0.05 mm or more and 0.2 mm or less. The thickness of the first organic insulating layer 14 includes an adhesive layer which bonds the first organic insulating layer 14 and the placing plate 11 together and an adhesive layer which bonds the first organic insulating layer 14 and the electrostatic attraction electrode 13. If the thickness of the first organic insulating layer 14 is less than 0.05 mm, the insulation between the electrostatic attraction electrode 13 and the placing plate 11 is broken by the voltage applied to the electrostatic attraction electrode 13, and thus there is a concern that electric discharge may occur. On the other hand, if the thickness of the first organic insulating layer 14 exceeds 0.2 mm, the distance between the electrostatic attraction electrode 13 and the plate-like sample W becomes too large, and thus there is a concern that it may become difficult to sufficiently attract and fix the plate-like sample W with a desired strength.

The dielectric breakdown voltage of the first organic insulating layer 14 is preferably 5 kV or more and more preferably 10 kV or more. As a material for forming the first organic insulating layer 14, for example, a material exhibiting a dielectric breakdown strength (unit: kV/mm) capable of realizing a desired dielectric breakdown voltage in the thickness of the first organic insulating layer 14 described above is used. Further, it is acceptable if it is a material having sufficient heat resistance not to cause deterioration or deformation at a temperature in the use environment of the electrostatic chuck device 1A. As a material for forming the first organic insulating layer 14, polyimide resin, silicone resin, or epoxy resin can be given as an example.

In general, these formation materials have a larger dielectric breakdown strength than the ceramic which is a material for forming the placing plate 11. For example, the dielectric breakdown strength of polyimide resin is 300 kV/mm, which is remarkably strong compared to the dielectric breakdown strength (10 kV/mm) of $Al_2O_3$—SiC which is a material for forming the placing plate 11. For this reason, in a case of using the laminated body of the placing plate 11 and the first organic insulating layer 14, a larger dielectric breakdown voltage can be obtained even in the same thickness, compared to a case of using only the placing plate 11 using ceramic as a formation material thereof.

Further, in a case where a weak place liable to cause a pinhole defect is present in the placing plate 11, in a configuration using only the placing plate 11, if a high voltage is applied to the electrostatic attraction electrode 13, a pinhole is easily generated in the weak place, and thus dielectric breakdown easily occur.

On the other hand, in a case of using the laminated body of the placing plate 11 and the first organic insulating layer 14, in a case where a weak place of the placing plate 11 and a weak place of the first organic insulating layer 14 accidentally overlap in plan, eventually, the weak portions become a place where a pinhole defect is easily generated in the entire laminated body. For this reason, even if a weak place is present in the placing plate 11 or the first organic insulating layer 14, a problem hardly occurs.

Variation in the in-plane thickness of the first organic insulating layer 14 is preferably within 50 μm and more preferably within 10 μm. If variation in the in-plane thickness of the first organic insulating layer 14 exceeds 50 μm, a difference in height is generated in a temperature distribution according to the magnitude of the thickness. As a result, the temperature control by thickness adjustment of the first organic insulating layer 14 is adversely affected, and therefore it is not preferable. Further, an attraction force becomes uneven in the plane of the placement surface 19, and therefore it is not preferable.

The thermal conductivity of the first organic insulating layer 14 is preferably 0.05 W/mk or more and more preferably 0.1 W/mk or more.

If the thermal conductivity is less than 0.05 W/mk, the thermal conduction from the electrostatic chuck section 2 to the temperature regulating base 3 through a second organic insulating layer 7 becomes difficult, so that a cooling rate decreases, and therefore it is not preferable.

Further, it is favorable if the thermal conductivity of the first organic insulating layer 14 is controlled such that the heat transfer rate between the placing plate 11 and the electrostatic attraction electrode 13 is greater than 750 $W/m^2K$ and more preferably greater than 4000 $W/m^2K$.

The electrostatic attraction electrode 13 is used as an electrode for an electrostatic chuck for generating electric charges and fixing the plate-like sample W with an electrostatic attraction force, and the shape or size thereof is appropriately adjusted according to a use thereof. For example, the electrostatic attraction electrode 13 is provided as an electrode having a predetermined pattern in a layer where the electrostatic attraction electrode 13 is formed. The electrostatic attraction electrode 13 functions even if it is provided as a so-called solid electrode which does not have a pattern.

The electrostatic attraction electrode 13 can be formed by bonding nonmagnetic metal foil which is a material for forming the electrostatic attraction electrode 13 to the first organic insulating layer 14, or by forming a film by sputtering or vapor deposition. In addition, it can be formed by applying a compound material of a conductive material, which is a material for forming the electrostatic attraction electrode 13, and an organic material by using a coating method such as screen printing.

The electrostatic attraction electrode 13 can be formed of conductive ceramic such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, or an yttrium oxide-molybdenum ($Y_2O_3$—Mo) conductive composite sintered body, or high melting point metal such as tungsten (W), tantalum (Ta), or molybdenum (Mo).

Further, the electrostatic attraction electrode 13 can also be formed of copper (Cu), aluminum (Al), or carbon (C).

The thickness of the electrostatic attraction electrode 13 is not particularly limited. However, the thickness of the electrostatic attraction electrode 13 is preferably 0.1 μm or more and 100 μm or less and more preferably 5 μm or more and 50 μm or less. If the thickness is less than 0.1 μm, sufficient electrical conductivity cannot be secured. On the other hand, if the thickness exceeds 100 μm, cracking easily occurs in the joint interface between the electrostatic attraction electrode 13 and the placing plate 11 due to a difference in coefficient of thermal expansion between the electrostatic attraction electrode 13 and the placing plate 11.

The electrostatic attraction electrode 13 may have the same size as the first organic insulating layer 14 when viewed from above. However, the electrostatic attraction electrode 13 may have a configuration in which it is smaller than the first organic insulating layer 14 when viewed from above. By making the electrostatic attraction electrode 13 have such a configuration, the first organic insulating layer 14 is also present obliquely upward from an end portion of the electrostatic attraction electrode 13 toward the outside of the device. For this reason, it is possible to obtain the effect of improving a withstand voltage due to providing the first organic insulating layer 14 not only vertically above the electrostatic attraction electrode 13 but also obliquely above the electrostatic attraction electrode 13, and it is possible to suppress dielectric breakdown.

The power supply terminal 15 is a rod-shaped member provided in order to apply a direct-current voltage to the electrostatic attraction electrode 13, and a material for forming the power supply terminal 15 is not particularly limited as long as it is an electrically conductive material having excellent heat resistance, and a metal material or a conductive organic material can be used. The electric conductivity of the power supply terminal 15 is preferably $10^4$ Ω·cm or less.

It is preferable that the power supply terminal 15 has a coefficient of thermal expansion close to the coefficients thermal expansion of the electrostatic attraction electrode 13, and for example, conductive ceramic configuring the electrostatic attraction electrode 13 or a metal material such as tungsten (W), tantalum (Ta), molybdenum (Mo), niobium (Nb), or a kovar alloy is suitably used.

The power supply terminal 15 is insulated from the temperature regulating base 3 by an insulator 23 having insulation properties.

The temperature regulating base 3 is disposed on the side opposite to the placing plate 11 side of the electrostatic attraction electrode 13 (below the electrostatic attraction electrode 13) and cools the placing plate 11 to adjust the temperature of the placing plate 11 to a desired temperature. The temperature regulating base 3 has a thick disk shape. Further, the temperature regulating base 3 is formed to be greater than the electrostatic chuck section 2 (the electrostatic attraction electrode 13 and the first organic insulating layer 14) when viewed from above.

As the temperature regulating base 3, for example, a water-cooled base or the like, in which a flow path (not shown) for circulating water is formed in the interior thereof, is suitable.

As a material for configuring the temperature regulating base 3, it is not particularly limited as long as it is metal which is excellent in thermal conductivity, electric conductivity, and workability, or a compound material which includes the metal, and for example, aluminum (Al), an aluminum alloy, copper (Cu), a copper alloy, stainless steel (SUS), titanium, or the like is suitably used. It is preferable that at least the surface which is exposed to plasma, of the temperature regulating base 3, is subjected to alumite treatment or has an insulating film such as alumina formed thereon.

The second organic insulating layer 7 is a film-shaped or sheet-shaped resin having insulation properties and voltage resistance and is provided between the temperature regulating base 3 and the electrostatic attraction electrode 13. In this embodiment, the second organic insulating layer 7 is bonded to the upper surface of the temperature regulating base 3 through an adhesive layer (not shown).

In the electrostatic chuck device 1A of this embodiment, in a case where a high voltage is applied to the electrostatic attraction electrode 13 in order to obtain a strong electrostatic attraction force, the placing plate 11 and the first organic insulating layer 14 cooperate with each other to realize a high withstand voltage, above the electrostatic attraction electrode 13. On the other hand, if a high voltage is applied to the electrostatic attraction electrode 13, dielectric breakdown occurs between the electrostatic attraction electrode 13 and the temperature regulating base 3, and thus there is a concern that electric discharge may occur therebetween. However, in the electrostatic chuck device 1A, the second organic insulating layer 7 is provided, whereby the electrostatic attraction electrode 13 and the temperature regulating base 3 is insulated from each other so as to prevent electric discharge from occurring due to a high voltage which is applied to the electrostatic attraction electrode 13.

The second organic insulating layer 7 can have the same configuration (forming material and thickness) as that of the first organic insulating layer 14 described above. The first organic insulating layer 14 and the second organic insulating layer 7 may have the same configuration or may have different configurations.

An adhesion material that the first organic insulating layer 14 and the second organic insulating layer 7 have is a sheet-shaped or film-shaped adhesive resin having heat resistance and insulation properties, such as polyimide resin, silicone resin, or epoxy resin, for example, and the thickness thereof is preferably in a range of 5 μm to 100 μm and more preferably in a range of 10 μm to 50 μm.

Variation in the in-plane thickness of the adhesion material is preferably within 10 μm. If variation in the in-plane thickness of the adhesion material is within 10 μm, the accuracy of the temperature control of the electrostatic chuck section 2 by the temperature regulating base 3 falls within an allowable range in a plane, and thus it is possible to make the in-plane temperature in the placement surface 19 of the electrostatic chuck section 2 uniform.

The adhesive layer 8 is interposed between the lower surface of the electrostatic chuck section 2 and the upper surface of the temperature regulating base 3, covers the side surfaces of the first organic insulating layer 14, the electrostatic attraction electrode 13, and the second organic insulating layer 7, and bonds and integrates the electrostatic chuck section 2 and the temperature regulating base 3 together.

Further, the adhesive layer 8 has action of relaxing thermal stress.

The thickness of the adhesive layer 8 is not particularly limited. However, the thickness of the adhesive layer 8 is preferably 100 μm or more and 200 μm or less.

It is desirable that the adhesive layer 8 has few voids or defects in the interior of the adhesive layer 8, the interface between the adhesive layer 8 and the electrostatic chuck section 2, and the interface between the adhesive layer 8 and the temperature regulating base 3. If voids or defects are formed, the thermal conductivity decreases, and thus there is a concern that the in-plane temperature distribution of the plate-like sample W may not become uniform.

The adhesive layer 8 is formed of, for example, a cured body obtained by thermally curing a silicone-based resin composition, or acrylic resin. The adhesive layer 8 is preferably formed by filling a fluid resin composition between the electrostatic chuck section 2 and the temperature regulating base 3 and then thermally curing it.

Further, the upper surface of the temperature regulating base 3 and the lower surface of the electrostatic chuck section 2 may not be necessarily flat. By forming the adhesive layer 8 by filling a fluid resin composition between the temperature regulating base 3 and the electrostatic chuck section 2 and then curing it, it is possible to suppress the occurrence of voids in the adhesive layer 8 due to the irregularities of the electrostatic chuck section 2 and the temperature regulating base 3. In this way, it is possible to make the heat conduction characteristics of the adhesive layer 8 uniform in a plane and enhance the temperature uniformity of the electrostatic chuck section 2.

Further, in the electrostatic chuck device 1A, a cooling gas introduction hole (a through hole) 18 penetrating the entire device in the thickness (height) direction is formed. Cooling gas such as He is supplied from the cooling gas introduction hole 18. The cooling gas flows through the gap between the placement surface 19 of the electrostatic chuck section 2 and the lower surface of the plate-like sample W, thereby increasing the heat transfer rate between the placement surface 19 and the plate-like sample W, and thereby serving to lower the temperature of the plate-like sample W. The peripheral wall 17 of the placing plate 11 suppresses the leakage of the cooling gas which is introduced between the placement surface 19 and the plate-like sample W.

A first through hole 11*h* penetrating in the direction of thickness of the placing plate 11 is provided in the placing plate 11 as the cooling gas introduction hole 18 is formed.

Further, the electrostatic attraction electrode 13 is formed to avoid the cooling gas introduction hole 18. Further, a second through hole 14*h* penetrating in the direction of thickness of the first organic insulating layer 14 and communicating with the first through hole 11*h* is provided in the first organic insulating layer 14.

The second through hole 14*h* is formed to be greater than the first through hole 11*h* when viewed from above. The side surface (indicated by reference numeral 13*h* in the drawing) of the electrostatic attraction electrode 13 and the side surface of the second through hole 14*h* are covered with the adhesive layer 8.

Further, a through hole 7*h* penetrating in the direction of thickness of the second organic insulating layer 7 is provided in the second organic insulating layer 7. The electrostatic chuck device 1A of this embodiment has the configuration as described above.

According to the electrostatic chuck device 1A having the configuration as described above, it is possible to provide a novel electrostatic chuck device having a high withstand voltage.

[Second Embodiment]

Figure 2:
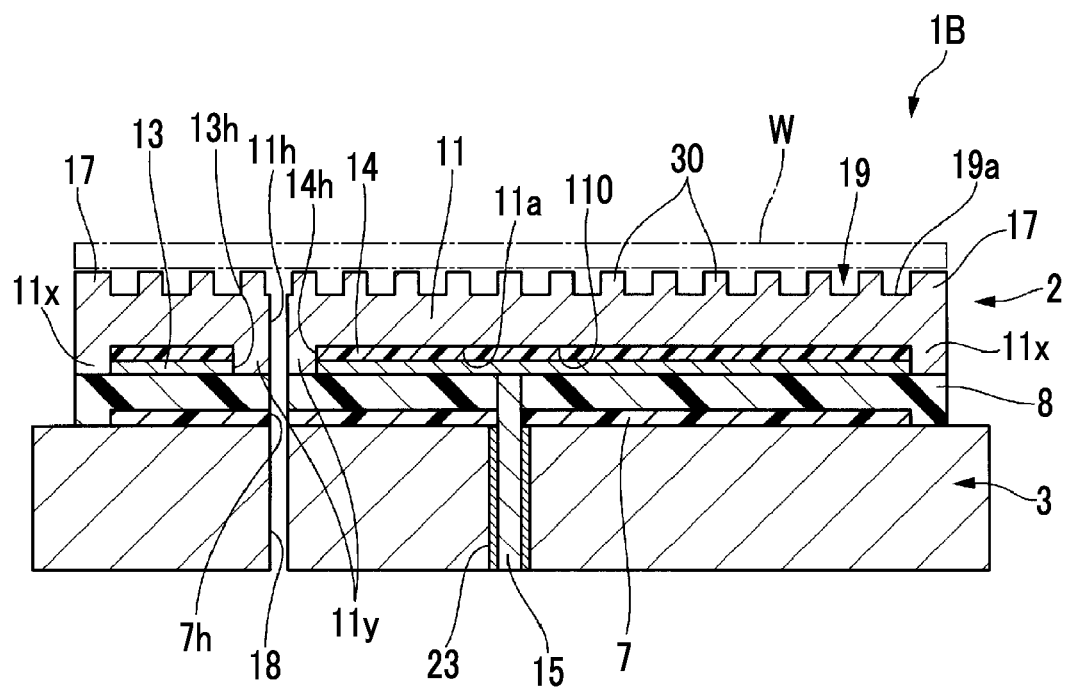
FIG. 2 is a cross-sectional view of an electrostatic chuck device according to a second embodiment of the present invention.

FIG. 2 is a cross-sectional view of an electrostatic chuck device 1B according to a second embodiment of the present invention and is a diagram corresponding to FIG. 1. The electrostatic chuck device 1B of this embodiment is partly shared by the electrostatic chuck device 1A of the first embodiment.

Therefore, in this embodiment, constituent elements shared by the first embodiment are denoted by the same reference numerals, and a detailed description thereof is omitted.

The placing plate 11 of the electrostatic chuck device 1B has a first embankment 11*x* surrounding a lower surface (a surface on the other side) 11*a* of the placing plate 11 at a peripheral portion of the lower surface 11*a*. The first organic insulating layer 14 and the electrostatic attraction electrode 13 engage with an indentation 110 which is formed by the first embankment 11*x* and the lower surface 11*a*.

In this way, the side surfaces of the first organic insulating layer 14 and the electrostatic attraction electrode 13 are covered with ceramic having higher durability against plasma than the adhesive layer 8. For this reason, compared to the electrostatic chuck device 1A, the configuration existing on the side of the side surfaces of the first organic insulating layer 14 and the electrostatic attraction electrode 13 hardly deteriorates under plasma environment. Therefore, in a case where a high voltage is applied to the electrostatic attraction electrode 13, it is difficult for electric discharge to occur from the side surfaces of the first organic insulating layer 14 and the electrostatic attraction electrode 13, and thus it is possible to improve the withstand voltage of the entire device.

Further, the placing plate 11 further has a second embankment 11*y* which surrounds the first through hole 11*h* on the lower surface 11*a* and is inserted into the second through hole 14*h*. In this way, the side surfaces of the first organic insulating layer 14 and the electrostatic attraction electrode 13, which face the cooling gas introduction hole 18, are covered with ceramic having higher durability against plasma than the adhesive layer 8. Therefore, in a case where a high voltage is applied to the electrostatic attraction electrode 13, it is difficult for electric discharge to occur from the side surfaces of the first organic insulating layer 14 and the electrostatic attraction electrode 13, and thus it is possible to improve the withstand voltage of the entire device.

The placing plate 11 having the first embankment 11*x* and the second embankment 11*y* as described above can be shaped by forming the indentation 110, for example, by performing counter-boring on a ceramic plate. The electrostatic chuck section 2 can be formed by bonding the first organic insulating layer 14 and the electrostatic attraction electrode 13 shaped in accordance with the shape of the indentation 110 when viewed from above, to the placing plate 11 shaped as described above. The first organic insulating layer 14 and the electrostatic attraction electrode 13 maybe sequentially bonded to the placing plate 11, or the first organic insulating layer 14 and the electrostatic attraction electrode 13 stacked in advance may be bonded to the placing plate 11.

Also in the electrostatic chuck device 1B having the configuration as described above, it is possible to provide a novel electrostatic chuck device having a high withstand voltage.

[Third Embodiment]

Figure 3:
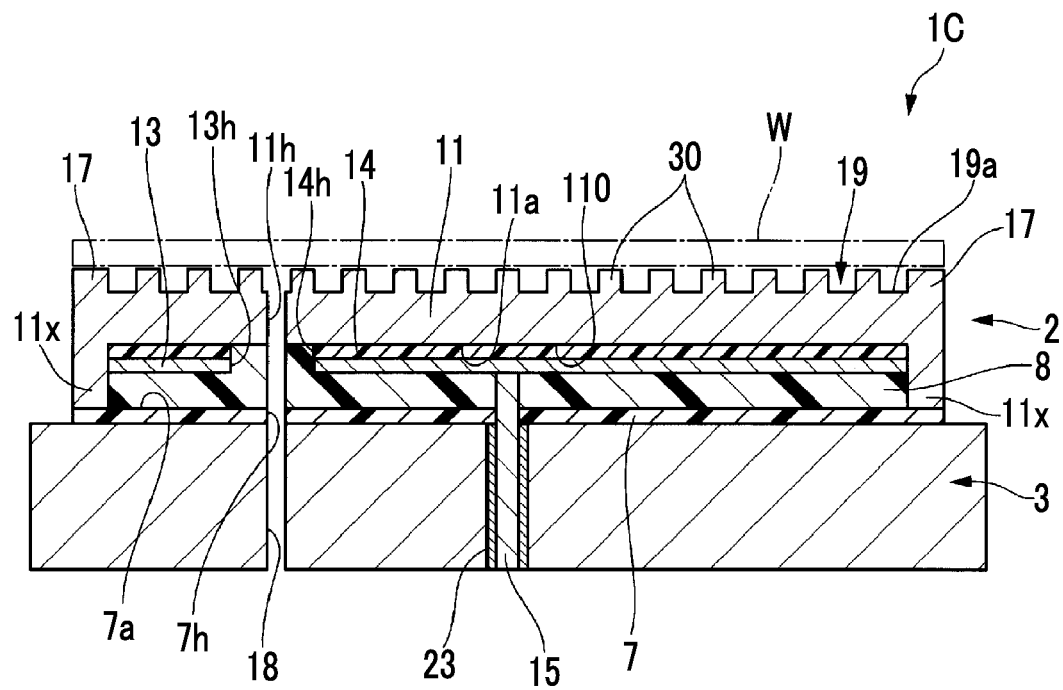
FIG. 3 is a cross-sectional view of an electrostatic chuck device according to a third embodiment of the present invention.

FIG. 3 is a cross-sectional view of an electrostatic chuck device 1C according to a third embodiment of the present invention and is a diagram corresponding to FIG. 1. Constituent elements already described in the description of the embodiments described above are denoted by the same reference numerals, and a detailed description thereof is omitted.

The placing plate 11 of the electrostatic chuck device 1C has the first embankment 11*x* surrounding the lower surface 11*a* of the placing plate 11 at the peripheral portion of the lower surface 11*a*. The first embankment 11*x* is provided in contact with the second organic insulating layer 7. For this reason, the first organic insulating layer 14, the electrostatic attraction electrode 13, and the adhesive layer 8 are sealed in a space surrounded by the placing plate 11 and the second organic insulating layer 7.

In the electrostatic chuck device 1C, the second organic insulating layer 7 is provided so as to have the same shape as the placing plate 11 when viewed from above. The first embankment 11*x* is provided in contact with a surface 7*a* on the placing plate 11 side of the second organic insulating layer 7. For example, the first embankment 11*x* is bonded through an adhesive layer (not shown) provided on the surface 7*a* of the second organic insulating layer 7.

In the electrostatic chuck device 1C having such a configuration, the side surfaces of the first organic insulating layer 14, the electrostatic attraction electrode 13, and the adhesive layer 8 are covered with ceramic having higher durability against plasma than the adhesive layer 8. Therefore, in a case where a high voltage is applied to the electrostatic attraction electrode 13, it is difficult for electric discharge to occur from the side surfaces of the first organic insulating layer 14 and the electrostatic attraction electrode 13, and thus it is possible to improve the withstand voltage of the entire device.

Also in the electrostatic chuck device 1C having the configuration as described above, it is possible to provide a novel electrostatic chuck device having a high withstand voltage.

In the electrostatic chuck device 1C, the first embankment 11x is provided in contact with the surface 7a on the placing plate 11 side of the second organic insulating layer 7. However, the second organic insulating layer 7 may also engage with the indentation 110.

Further, in the electrostatic chuck device 1C, the placing plate 11 may further have the second embankment 11y on the lower surface 11a.

[Fourth Embodiment]

Figure 4:
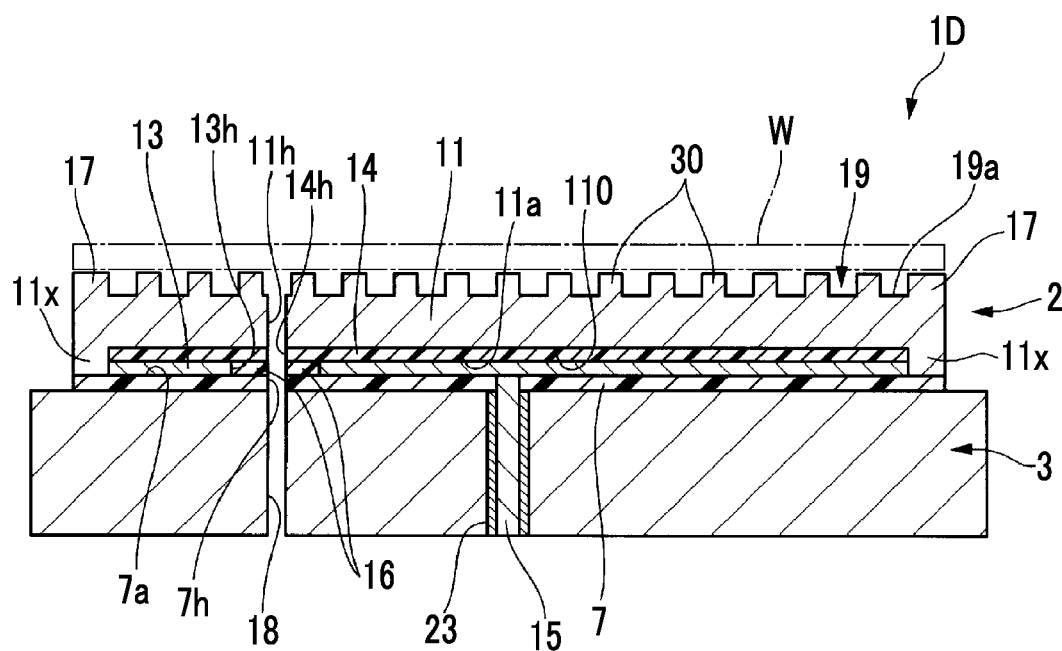
FIG. 4 is a cross-sectional view of an electrostatic chuck device according to a fourth embodiment of the present invention.

FIG. 4 is a cross-sectional view of an electrostatic chuck device 1D according to a fourth embodiment of the present invention and is a diagram corresponding to FIG. 1. Constituent elements already described in the description of the embodiments described above are denoted by the same reference numerals, and a detailed description thereof is omitted.

The placing plate 11 of the electrostatic chuck device 1D has the first embankment 11x surrounding the lower surface 11a of the placing plate 11 at the peripheral portion of the lower surface 11a. The first organic insulating layer 14 and the electrostatic attraction electrode 13 engage with the indentation 110 which is formed by the first embankment 11x and the lower surface 11a.

In the first embankment 11x of the electrostatic chuck device 1D, the height thereof from the lower surface 11a is substantially the same as the total thickness of the first organic insulating layer 14 and the electrostatic attraction electrode 13. For this reason, in the electrostatic chuck device 1D, unlike the electrostatic chuck devices 1A to 1C of the first to third embodiments, the first embankment 11x and the electrostatic attraction electrode 13 are provided in contact with the second organic insulating layer 7 without interposing the adhesive layer 8 therebetween. For example, the first embankment 11x and the electrostatic attraction electrode 13 are bonded through an adhesive layer (not shown) provided on the surface 7a of the second organic insulating layer 7.

In this way, the first organic insulating layer 14 and the electrostatic attraction electrode 13 are sealed in a space surrounded by the placing plate 11 and the second organic insulating layer 7. Further, the adhesive layer 8 is not used, whereby it is not necessary to consider coating unevenness when forming the adhesive layer 8, and thus it becomes easy to uniformly control the in-plane temperature distribution of the plate-like sample W.

In a case where the first organic insulating layer 14 and the electrostatic attraction electrode 13 are bonded together through a sheet-shaped adhesion material (a sheet adhesion material), if the thickness of the electrostatic attraction electrode 13 is 10 μm or less, the sheet adhesion material is deformed, whereby the sheet adhesion material is disposed between the electrostatic attraction electrode 13 and the cooling gas introduction hole 18. In this way, the electrostatic attraction electrode 13 and the cooling gas introduction hole 18 are electrically insulated from each other.

The same applies to a case where the second organic insulating layer 7 and the electrostatic attraction electrode 13 are bonded together through a sheet-shaped adhesion material (a sheet adhesion material).

If the thickness of the electrostatic attraction electrode 13 exceeds 10 μm, an insulating layer filling the gap of the pattern of the electrostatic attraction electrode 13 is disposed in accordance with the pattern of the electrostatic attraction electrode 13. Such an insulating layer is obtained, for example, by processing an insulating sheet into a pattern complementary to the pattern of the electrostatic attraction electrode 13 and then disposing it.

In this way, voids do not remain in the electrostatic chuck section 2, and therefore, breakage thereof can be suppressed.

As a material for forming a third organic insulating layer 16, the same material as that of the first organic insulating layer 14 or the second organic insulating layer 7 described above can be used. The material for forming the third organic insulating layer 16 may be the same as or different from those of the first organic insulating layer 14 and the second organic insulating layer 7. Further, an adhesion material of the third organic insulating layer 16 can have the same configuration (forming material and thickness) as the adhesion material of the first organic insulating layer 14 or the second organic insulating layer 7 described above.

In this way, the electrostatic attraction electrode 13 is surrounded by the placing plate 11, the first organic insulating layer 14, the second organic insulating layer 7, and the third organic insulating layer 16.

In the electrostatic chuck device 1D having such a configuration, the electrostatic attraction electrode 13 is surrounded by the first to third organic insulating layers having a high withstand voltage and ceramic having higher durability against plasma than the adhesive layer 8. For this reason, it is possible to suppress deterioration due to plasma and improve the withstand voltage of the entire device.

The first organic insulating layer 14 or the third organic insulating layer 16 facing the cooling gas introduction hole 18 uses, as a forming material thereof, resin having lower durability against plasma than the ceramic configuring the placing plate 11.

However, when the electrostatic chuck device 1D is used, the cooling gas introduction hole 18 is covered with the plate-like sample W placed on the placement surface 19, and therefore, the cooling gas introduction hole 18 is not directly exposed to plasma at the time of a use.

Further, when the placement surface 19 is dry-cleaned using plasma, the cooling gas introduction hole 18 is exposed to the plasma. However, in the dry cleaning, foreign matter on the surface of the placement surface 19 is removed by using plasma weaker than plasma which is used for plasma CVD, etching, or the like.

For this reason, the cooling gas introduction hole 18 is less susceptible to deterioration due to plasma than the side surface on the outer periphery side of the electrostatic chuck section 2 covered with the first embankment 11x.

In addition, by allowing a small amount of cooling gas to flow out from the cooling gas introduction hole 18 at the time of the dry cleaning, it is possible to suppress infiltration thereof into the cooling gas introduction hole 18.

For this reason, the first organic insulating layer 14 or the third organic insulating layer 16 can be adopted as a member that insulates the electrostatic attraction electrode 13, without excessively worrying about deterioration due to plasma with respect to the portion facing the cooling gas introduction hole 18.

Also in the electrostatic chuck device 1D having the configuration as described above, it is possible to provide a novel electrostatic chuck device having a high withstand voltage.

[Fifth Embodiment]

Figure 5:
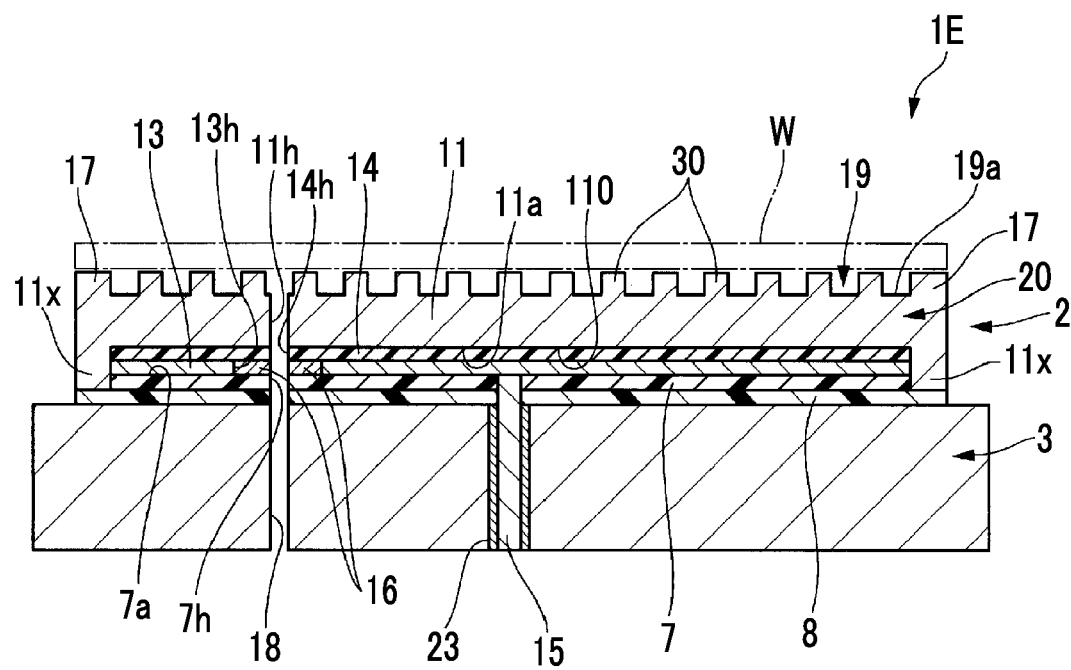
FIG. 5 is a cross-sectional view of an electrostatic chuck device according to a fifth embodiment of the present invention.

FIG. 5 is a cross-sectional view of an electrostatic chuck device 1E according to a fifth embodiment of the present invention and is a diagram corresponding to FIG. 1. Constituent elements already described in the description of the embodiments described above are denoted by the same reference numerals, and a detailed description thereof is omitted.

The placing plate 11 of the electrostatic chuck device 1E has the first embankment 11x surrounding the lower surface 11a of the placing plate 11 at the peripheral portion of the lower surface 11a. The first organic insulating layer 14, the electrostatic attraction electrode 13, and the second organic insulating layer 7 engage with the indentation 110 which is formed by the first embankment 11x and the lower surface 11a.

The second through hole 14h of the first organic insulating layer 14 has the same size as that of the first through hole 11h of the placing plate 11. The third organic insulating layer 16 surrounding the cooling gas introduction hole 18 is provided between the electrostatic attraction electrode 13 and the cooling gas introduction hole 18.

The placing plate 11, the electrostatic attraction electrode 13, the first organic insulating layer 14, the second organic insulating layer 7, and the third organic insulating layer 16 having such configurations are bonded to each other through an adhesion material, for example. As the adhesion material, a material described above can be used. In this way, the first organic insulating layer 14 and the electrostatic attraction electrode 13 are sealed in a space surrounded by the placing plate 11 and the second organic insulating layer 7, whereby an electrostatic chuck member 20 is configured.

The electrostatic chuck member 20 is bonded to the temperature regulating base 3 through the adhesive layer 8.

For example, by bonding a sheet-shaped or film-shaped adhesion material to the lower surface of the second organic insulating layer 7 and bonding it to the temperature regulating base 3, it is also possible to bond the electrostatic chuck member 20 to the temperature regulating base 3. However, in a case where the electrostatic chuck member 20 is bonded to the temperature regulating base 3 through the adhesive layer 8, even if a step is formed on the lower surface of the electrostatic chuck member 20, it can be flattened by the adhesive layer 8. For example, even in a case where the lower surface of the electrostatic chuck member 20 is not flat due to the tolerance at the time of the counter-boring of the placing plate 11, it is possible to favorably manufacture the electrostatic chuck device 1E.

Also in the electrostatic chuck device 1E having the configuration as described above, it is possible to provide a novel electrostatic chuck device having a high withstand voltage.

[Sixth Embodiment]

Figure 6:
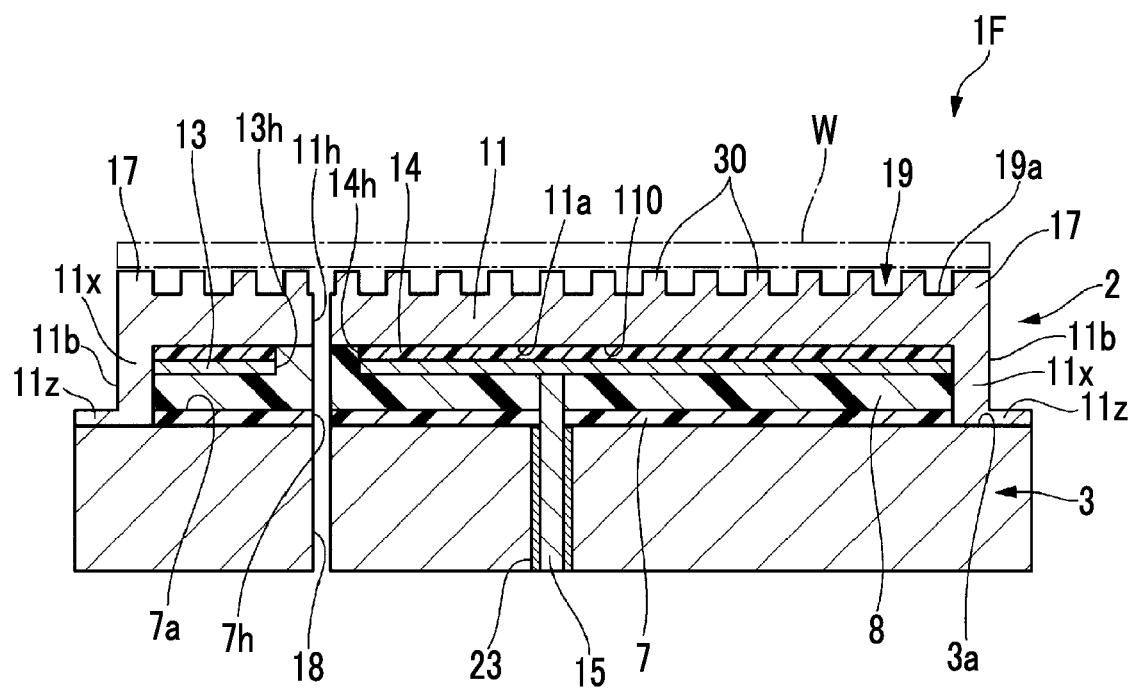
FIG. 6 is a cross-sectional view of an electrostatic chuck device according to a sixth embodiment of the present invention.

FIG. 6 is a cross-sectional view of an electrostatic chuck device 1F according to a sixth embodiment of the present invention and is a diagram corresponding to FIG. 1. Constituent elements already described in the description of the embodiments described above are denoted by the same reference numerals, and a detailed description thereof is omitted.

The placing plate 11 of the electrostatic chuck device 1F has the first embankment 11x surrounding the lower surface 11a of the placing plate 11 at the peripheral portion of the lower surface 11a. The first organic insulating layer 14 and the electrostatic attraction electrode 13 engage with the indentation 110 which is formed by the first embankment 11x and the lower surface 11a, and are stacked in the order of the first organic insulating layer 14 and the electrostatic attraction electrode 13 from the lower surface 11a.

Further, the second organic insulating layer 7 engages with the indentation 110. The second organic insulating layer 7 is bonded through the adhesive layer 8 formed in the indentation 110 so as to cover the first organic insulating layer 14 and the electrostatic attraction electrode 13.

Further, an outer peripheral portion 11z projecting outward from an outside surface 11b is formed at a lower end portion of the first embankment 11x. The outer peripheral portion 11z covers a surface 3a of the temperature regulating base 3.

Figure 7:
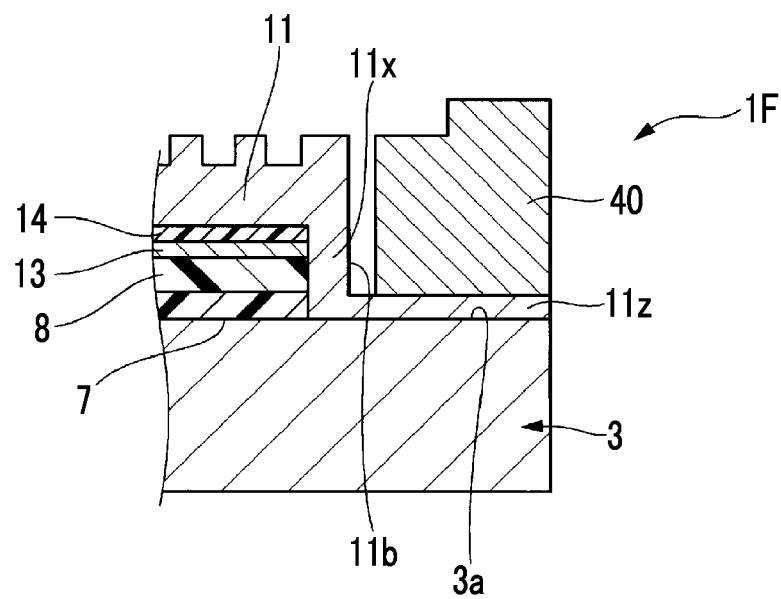
FIG. 7 is a partial enlarged view of the electrostatic chuck device according to the sixth embodiment of the present invention.

As shown in FIG. 7, in the electrostatic chuck device 1F, a focus ring 40 is disposed on the surface 3a of the temperature regulating base 3, which is covered with the outer peripheral portion 11z. The focus ring 40 is provided in order to generate uniform plasma by preventing plasma which is generated from concentrating on the center of the plate-like sample W or diffusing to the outer periphery conversely, when the electrostatic chuck device is used in a plasma process.

If a high voltage is applied to the electrostatic attraction electrode 13, there is a case where arc discharge occurs between the electrostatic chuck section 2 and the focus ring 40. Therefore, in the electrostatic chuck device 1F of this embodiment, a configuration is made in which a portion facing the focus ring 40 is covered with the first embankment 11x and the outer peripheral portion 11z of the placing plate 11 using ceramic as a forming material thereof. In this way, organic materials such as the adhesive layer, the adhesion material, and the organic insulating layer are not exposed to arc which is generated, and thus deterioration can be suppressed.

Figure 8:
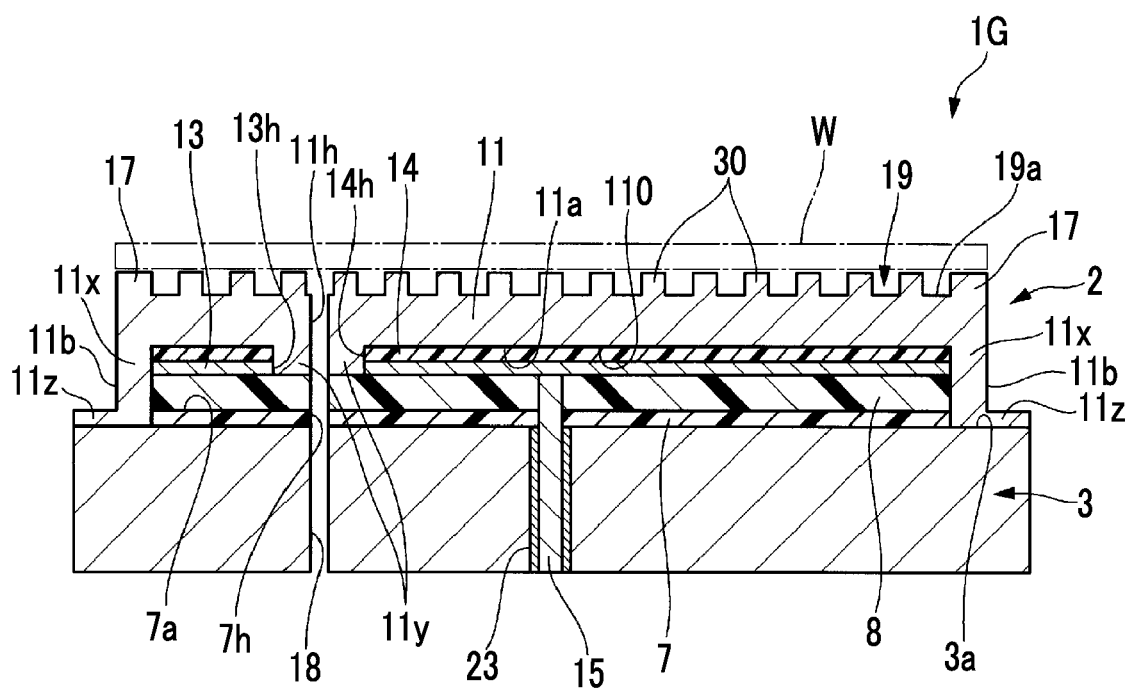
FIG. 8 is a cross-sectional view of an electrostatic chuck device according to a modification example of the sixth embodiment of the present invention.

As in an electrostatic chuck device 1G shown in FIG. 8, the placing plate 11 may further have the second embankment 11y on the lower surface 11a. In the electrostatic chuck device 1F having such a configuration, in a case where a high voltage is applied to the electrostatic attraction electrode 13, it is difficult for electric discharge to occur from the side surfaces of the first organic insulating layer 14 and the electrostatic attraction electrode 13, and thus it is possible to improve the withstand voltage of the entire device.

Also in the electrostatic chuck device 1F and the electrostatic chuck device 1G having the configurations as described above, it is possible to provide a novel electrostatic chuck device having a high withstand voltage.

[Seventh Embodiment]

Figure 9:
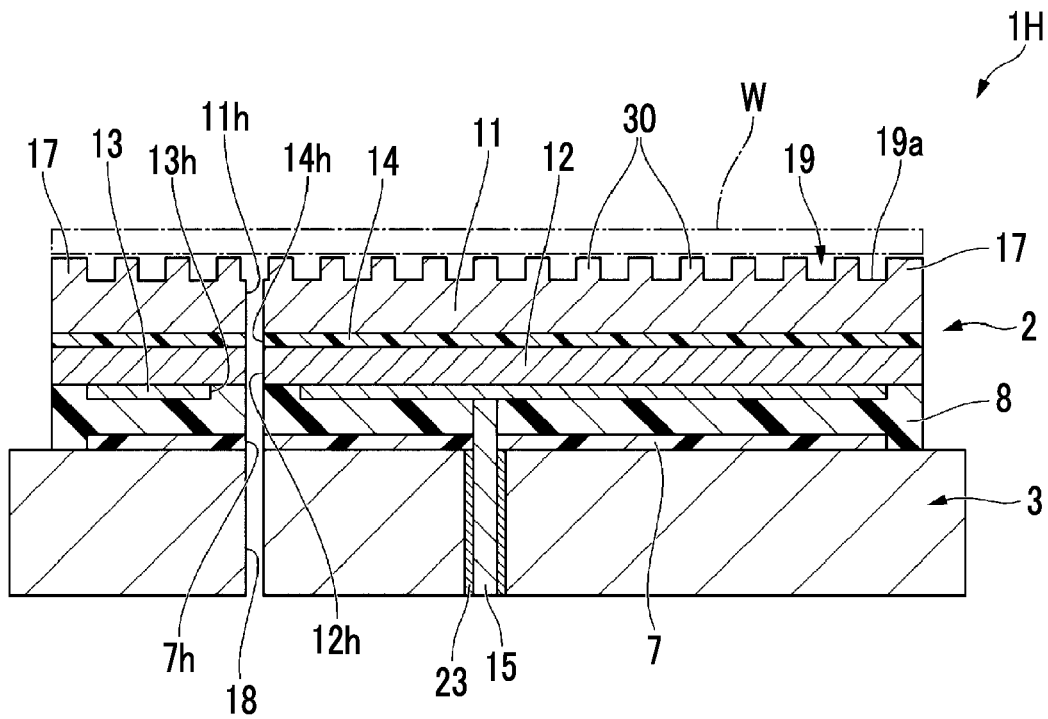
FIG. 9 is a cross-sectional view of an electrostatic chuck device according to a seventh embodiment of the present invention.

FIG. 9 is a cross-sectional view of an electrostatic chuck device 1H according to a seventh embodiment of the present invention and is a diagram corresponding to FIG. 1. Constituent elements already described in the description of the embodiments described above are denoted by the same reference numerals, and a detailed description thereof is omitted.

The electrostatic chuck section 2 has the placing plate (a first ceramic plate) 11 having an upper surface serving as the placement surface 19 on which the plate-like sample W such as a semiconductor wafer is placed, the electrostatic attraction electrode 13 provided on the surface (the surface on the other side) on the side opposite to the placement surface 19 of the placing plate 11, the first organic insulating layer 14 provided between the placing plate 11 and the electrostatic attraction electrode 13, and a supporting plate (a second ceramic plate) 12 provided between the electrostatic attraction electrode 13 and the first organic insulating layer 14.

The placing plate 11 and the supporting plate 12 are disk-shaped members in which the shapes of the superimposed surfaces are the same. Each of the placing plate 11 and the supporting plate 12 uses, as a forming material thereof, an insulating ceramic sintered body having mechanical strength and having durability against corrosive gas and plasma thereof, such as an aluminum oxide-silicon carbide ($Al_2O_3$—SiC) composite sintered body, an aluminum oxide ($Al_2O_3$) sintered body, an aluminum nitride (AlN) sintered body, an yttrium oxide ($Y_2O_3$) sintered body, or a cubic garnet type yttrium aluminum oxide (yttrium aluminum garnet: $5Al_2O_3 \cdot 3Y_2O_3$, YAG) sintered body.

The materials for forming the placing plate 11 and the supporting plate 12 may be the same. A configuration in which the placing plate 11 and the supporting plate 12 are formed using $Al_2O_3$—SiC composite sintered body can be given as an example.

Further, the materials for forming the placing plate 11 and the supporting plate 12 may be different from each other. In a case where the materials for forming the placing plate 11 and the supporting plate 12 are made to be different from each other, it is favorable if an appropriate forming material is selected according to the required physical properties which are required for each member.

For example, it is favorable if the placing plate 11 which is exposed to plasma during the use of the device is formed using an $Al_2O_3$ sintered body, a $Y_2O_3$ sintered body, a YAG sintered body, or the like having relatively high plasma resistance, among the forming materials described above, and the supporting plate 12 is formed using an $Al_2O_3$—SiC composite sintered body having a high dielectric constant, because the supporting plate 12 is not required to have plasma resistance as much as the placing plate 11. Due to such a configuration, the electrostatic chuck section 2 can be configured to be thin while improving the plasma resistance by the placing plate 11, and therefore, it is possible to maintain at least the attraction force which is exerted on the plate-like sample W.

The thickness of each of the placing plate 11 and the supporting plate 12 is preferably 0.2 mm or more and 0.5 mm or less. If the thickness of each of the placing plate 11 and the supporting plate 12 is less than 0.2 mm, the insulation between the placing plate 11 and the supporting plate 12 is broken by the voltage applied to the electrostatic attraction electrode 13, and thus there is a concern that electric discharge may occur.

On the other hand, it the thickness exceeds 0.5 mm, there is a concern that it may become difficult to sufficiently attract and fix the plate-like sample W with a desired strength. The total thickness of the placing plate 11 and the supporting plate 12 is preferably 0.4 mm or more and 1.0 mm or less.

The thickness of the first organic insulating layer 14 is preferably 0.025 mm or more. The upper limit value of the thickness of the first organic insulating layer 14 is, for example, 0.5 mm. The thickness of the first organic insulating layer 14 includes an adhesive layer which bonds the first organic insulating layer 14 and the placing plate 11 together and an adhesive layer which bonds the first organic insulating layer 14 and the electrostatic attraction electrode 13 together. If the thickness of the first organic insulating layer 14 is less than 0.025 mm, the insulation between the electrostatic attraction electrode 13 and the placing plate 11 is broken by the voltage applied to the electrostatic attraction electrode 13, and thus there is a concern that electric discharge may occur therebetween. On the other hand, if the thickness exceeds 0.5 mm, the distance between the electrostatic attraction electrode 13 and the plate-like sample W becomes too large, and thus there is a concern that it may become difficult to sufficiently attract and fix the plate-like sample W with a desired strength.

In general, the material for forming the first organic insulating layer 14 described above has a higher dielectric breakdown strength than the ceramic which is a material for forming the placing plate 11 and the supporting plate 12. For example, the dielectric breakdown strength of polyimide resin is 300 kV/mm, which is remarkably strong compared to the dielectric breakdown strength (10 kV/mm) of $Al_2O_3$—SiC which is a material for forming the placing plate 11 and the supporting plate 12. For this reason, in a case of using the laminated body of the placing plate 11, the first organic insulating layer 14, and the supporting plate 12 for the electrostatic chuck section 2, a larger dielectric breakdown voltage can be obtained even in the same thickness, compared to a case of using only the placing plate 11 using ceramic as a formation material thereof.

On the other hand, in a case of using the laminated body of the placing plate 11, the first organic insulating layer 14, and the supporting plate 12, in a case where a weak place of the placing plate 11, a weak place of the first organic insulating layer 14, and a weak place of the supporting plate 12 accidentally overlap in plan, eventually, a portion where the weak portions overlap becomes a portion where a pinhole defect easily occurs in the entire laminated body. For this reason, even if a weak place is present in the placing plate 11, the first organic insulating layer 14, or the supporting plate 12, a problem hardly occurs.

The electrostatic attraction electrode 13 can be formed by bonding nonmagnetic metal foil which is a material for forming the electrostatic attraction electrode 13 to the supporting plate 12, or by forming a film by sputtering or vapor deposition. In addition, it can be formed by applying a compound material of a conductive material, which is a material for forming the electrostatic attraction electrode 13, and an organic material by using a coating method such as screen printing.

The thickness of the electrostatic attraction electrode 13 is not particularly limited. However, the thickness of the electrostatic attraction electrode 13 is preferably 0.1 μm or more and 100 μm or less and more preferably 10 μm or more and 50 μm or less. If the thickness is less than 0.1 μm, sufficient electrical conductivity cannot be secured. On the other hand, if the thickness exceeds 100 μm, cracking easily occurs in the joint interface between the electrostatic attraction electrode 13 and the supporting plate 12 due to a difference in coefficient of thermal expansion between the electrostatic attraction electrode 13 and the supporting plate 12.

The electrostatic attraction electrode 13 having such a thickness can be easily formed by a film formation method such as a sputtering method or a vapor deposition method, or a coating method such as a screen printing method, in addition to bonding and then shaping a thin film made of the material for forming the electrostatic attraction electrode 13.

As a material for configuring the temperature regulating base 3, it is not particularly limited as long as it is metal which is excellent in thermal conductivity, electric conductivity, and workability, or a compound material which includes the metal, and for example, aluminum (Al), an aluminum alloy, copper (Cu), a copper alloy, stainless steel (SUS), or the like is suitably used. It is preferable that at least the surface which is exposed to plasma, of the temperature regulating base 3, is subjected to alumite treatment or has an insulating film such as alumina formed thereon.

The second organic insulating layer 7 can have the same configuration (forming material and thickness) as that of the first organic insulating layer 14 described above. For example, the thickness of the second organic insulating layer 7 is preferably 0.05 mm or more.

The upper limit value of the thickness of the second organic insulating layer 7 is, for example, 0.5 mm. The first organic insulating layer 14 and the second organic insulating layer 7 may have the same configuration or may have different configurations.

The adhesive layer 8 is interposed between the lower surface of the electrostatic chuck section 2 and the upper surface of the temperature regulating base 3, covers the side surfaces of the electrostatic attraction electrode 13 and the second organic insulating layer 7, and bonds and integrates the electrostatic chuck section 2 and the temperature regulating base 3 together. Further, the adhesive layer 8 has action of relaxing thermal stress.

The first through hole 11h penetrating in the direction of thickness of the placing plate 11 is provided in the placing plate 11 as the cooling gas introduction hole 18 is formed,.

Further, the electrostatic attraction electrode 13 is formed to avoid the cooling gas introduction hole 18.

Further, the second through hole 14h penetrating in the direction of thickness of the first organic insulating layer 14 and communicating with the first through hole 11h is provided in the first organic insulating layer 14.

Further, a third through hole 12h penetrating in the direction of thickness of the supporting plate 12 and communicating with the first through hole 11h and the second through hole 14h is provided in the supporting plate 12.

The second through hole 14h and the third through hole 12h have the same size as the first through hole 11h.

The side surface (indicated by reference numeral 13h in the drawing) of the electrostatic attraction electrode 13 is covered with the adhesive layer 8. The electrostatic chuck device 1H of this embodiment has the configuration as described above.

According to the electrostatic chuck device 1H having the configuration as described above, it is possible to provide a novel electrostatic chuck device having a high withstand voltage.

[Eighth Embodiment]

Figure 10:
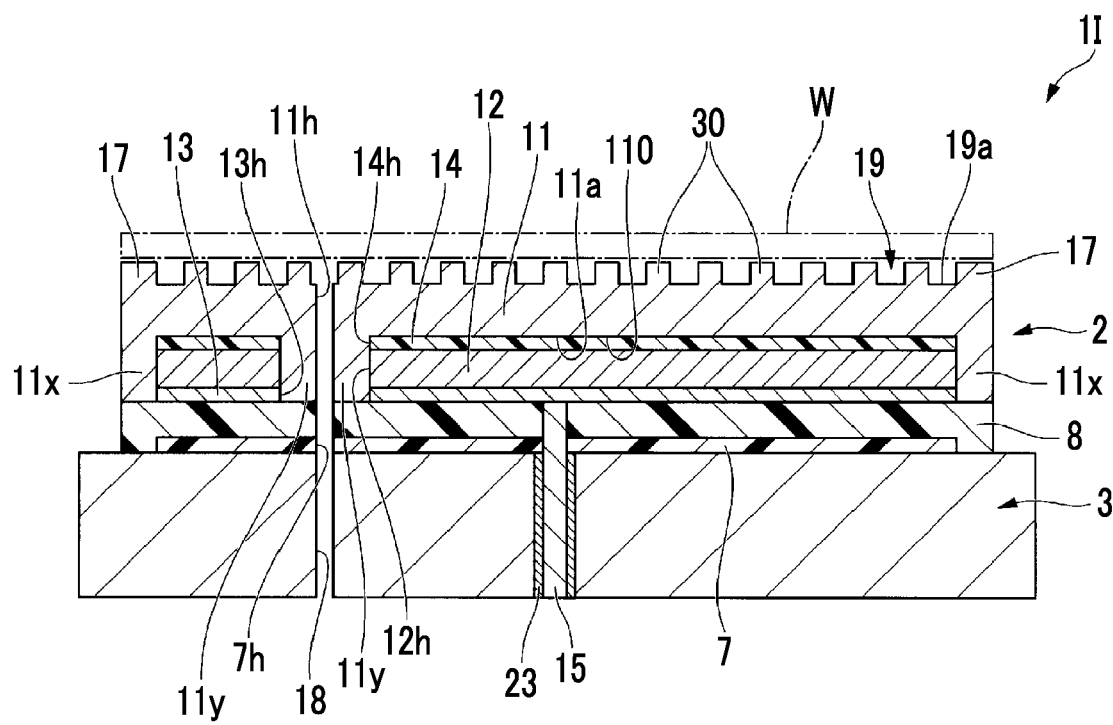
FIG. 10 is a cross-sectional view of an electrostatic chuck device according to an eighth embodiment of the present invention.

FIG. 10 is a cross-sectional view of an electrostatic chuck device 1I according to an eighth embodiment of the present invention and is a diagram corresponding to FIG. 1. Constituent elements already described in the description of the embodiments described above are denoted by the same reference numerals, and a detailed description thereof is omitted.

The placing plate 11 of the electrostatic chuck device 1I has the first embankment 11x surrounding the lower surface 11a (the surface on the other side) of the placing plate 11 at the peripheral portion of the lower surface 11a. The first organic insulating layer 14, the supporting plate 12, and the electrostatic attraction electrode 13 engage, in this order, with the indentation 110 which is formed by the first embankment 11x and the lower surface 11a.

Further, the second through hole 14h of the first organic insulating layer 14 and the third through hole 12h of the supporting plate 12 are formed to be greater than the first through hole 11h. Further, the side surface 13h of the electrostatic attraction electrode 13 is separated from the cooling gas introduction hole 18. The placing plate 11 further has the second embankment 11y which surrounds the first through hole 11h on the lower surface 11a and is inserted into the second through hole 14h and the third through hole 12h. In this way, the side surface of the first organic insulating layer 14 and the electrostatic attraction electrode 13, which face the cooling gas introduction hole 18, are covered with ceramic having higher durability against plasma than the adhesive layer 8. Therefore, in a case where a high voltage is applied to the electrostatic attraction electrode 13, it is difficult for electric discharge to occur from the side surfaces of the first organic insulating layer 14 and the electrostatic attraction electrode 13, and thus it is possible to improve the withstand voltage of the entire device.

Further, the first organic insulating layer 14 is sealed in a space surrounded by the placing plate 11 and the supporting plate 12. That is, the entire periphery of the first organic insulating layer 14 is covered with ceramic. For this reason, deterioration due to plasma, of the first organic insulating layer 14, is suppressed to a minimum.

Figure 11:
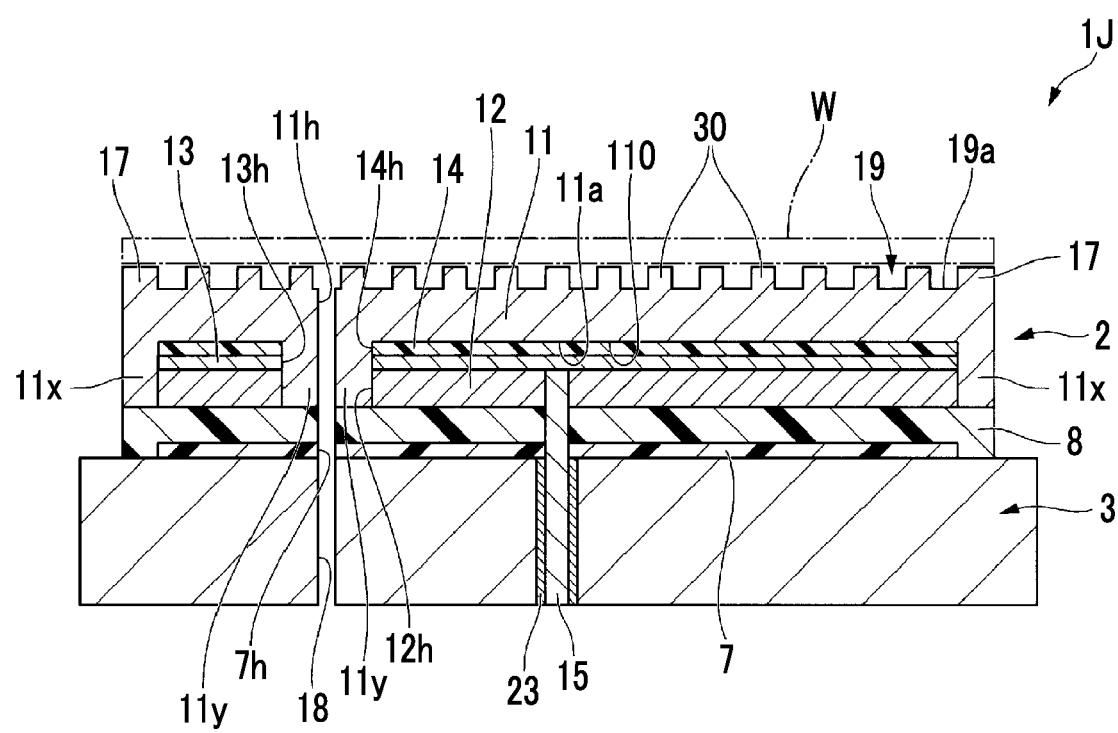
FIG. 11 is a cross-sectional view of an electrostatic chuck device according to a modification example of the eighth embodiment of the present invention.

As in an electrostatic chuck device 1J shown in FIG. 11, a configuration maybe made in which the first organic insulating layer 14, the electrostatic attraction electrode 13, and the supporting plate 12 in order from the lower surface 11a are stacked in order in the indentation 110. In the electrostatic chuck device 1J having such a configuration, the first organic insulating layer 14 and the electrostatic attraction electrode 13 may be sequentially bonded, or the first organic insulating layer 14 and the electrostatic attraction electrode 13 stacked in advance may be bonded. In the case of such a configuration, the electrostatic attraction electrode 13 and the supporting plate 12 are bonded together through, for example, a sheet-shaped adhesion material (a sheet adhesion material).

In a case where the electrostatic attraction electrode 13 is formed as an electrode having a predetermined pattern, if the thickness of the electrostatic attraction electrode 13 is 10 μm or less, the sheet adhesion material is deformed, whereby the sheet adhesion material is disposed in the gap of the pattern of the electrostatic attraction electrode 13.

In a case where the thickness of the electrostatic attraction electrode 13 exceeds 10 μm, an insulating layer filling the gap of the pattern of the electrostatic attraction electrode 13 is disposed in accordance with the pattern of the electrostatic attraction electrode 13. Such an insulating layer can be obtained, for example, by processing an insulating sheet into a pattern complementary to the pattern of the electrostatic attraction electrode 13 and then disposing it.

In this way, voids do not remain in the electrostatic chuck section 2, and therefore, breakage can be suppressed.

Also in the electrostatic chuck device 1I and the electrostatic chuck device 1J having the configurations as described above, it is possible to provide a novel electrostatic chuck device having a high withstand voltage.

The preferred embodiments according to the present invention have been described above with reference to the accompanying drawings. However, the present invention is not limited to these embodiments. The shapes, combinations, and the like of the respective constituent members shown in the above-described embodiments are merely examples, and various modifications can be made based on design requirements or the like within a scope which does not depart from the gist of the present invention.

INDUSTRIAL APPLICABILITY

It is possible to provide a novel electrostatic chuck device having a high withstand voltage.

REFERENCE SIGNS LIST 1A, 1B, 1C, 1D, 1E, 1F, 1H, 1I, 1J: electrostatic chuck device
2: electrostatic chuck section
3: temperature regulating base
3a: surface
7: second organic insulating layer
7a: surface 7h: through hole
8: adhesive layer
W: plate-like sample
11: placing plate (first ceramic plate)
11a: lower surface (surface on the other side)
11b: outside surface
11h: first through hole
11x: first embankment
11y: second embankment
11z: outer peripheral portion
12: supporting plate (second ceramic plate)
12h: third through hole
13: electrostatic attraction electrode
14: first organic insulating layer
14h: second through hole
16: third organic insulating layer
18: cooling gas introduction hole (through hole)
19: placement surface
20: electrostatic chuck member
110: indentation

The invention claimed is:

1. An electrostatic chuck device, comprising:
a first ceramic plate having a placement surface on which a plate-like sample is placed on a first side thereof;
an electrostatic attraction electrode provided on a second side of the first ceramic plate; and
a first organic insulating layer provided between the first ceramic plate and the electrostatic attraction electrode; and
a temperature regulating base configured to cool the first ceramic plate and arranged on the electrostatic attraction electrode on the opposite side from the first ceramic plate,
wherein the first ceramic plate has a first embankment surrounding the second side along the periphery of the second side,
the first organic insulating layer and the electrostatic attraction electrode engage with an indentation formed by the first embankment and the second side,
an adhesive layer is provided between the first ceramic plate and the first organic insulating layer,
the first ceramic plate is made of an insulating ceramic sintered body, and
the surface on the side to the first ceramic plate of the temperature regulating base is flat.

2. The electrostatic chuck device according to claim 1, further comprising:
a second organic insulating layer provided between the temperature regulating base and the electrostatic attraction electrode.

3. The electrostatic chuck device according to claim 1, further comprising:
a second organic insulating layer provided between the temperature regulating base and the electrostatic attraction electrode; wherein,
the first embankment is provided in contact with the second organic insulating layer, and
the first organic insulating layer and the electrostatic attraction electrode are sealed in a space surrounded by the first ceramic plate and the second organic insulating layer.

4. The electrostatic chuck device according to claim 3, wherein the first embankment is provided in contact with the second organic insulating layer on the side of the first ceramic plate.

5. The electrostatic chuck device according to claim 3, wherein the second organic insulating layer engages with the indentation.

6. The electrostatic chuck device according to claim 5, further comprising:
an adhesive layer that adheres an electrostatic chuck member, in which the first organic insulating layer and the electrostatic attraction electrode are sealed in the space surrounded by the first ceramic plate and the second organic insulating layer, to the temperature regulating base.

7. The electrostatic chuck device according to claim 5, wherein the electrostatic attraction electrode and the first organic insulating layer are formed to be smaller than the temperature regulating base when viewed from above, and
the first embankment has an outer peripheral portion that covers the surface of the temperature regulating base and provided projecting outward from the outside surface.

8. The electrostatic chuck device according to claim 1, wherein a through hole is provided that passes through the entire electrostatic chuck device in the direction of thickness,
the first ceramic plate has a first through hole that passes therethrough in the direction of thickness,
the electrostatic attraction electrode is formed while avoiding the through hole,
the first organic insulating layer has a second through hole that passes therethrough in the direction of thickness and communicates with the first through hole, and
the first ceramic plate further has a second embankment that surrounds the periphery of the first through hole and is inserted into the second through hole.

9. The electrostatic chuck device according to claim 1, wherein a through hole is provided that passes through the entire electrostatic chuck device in the direction of thickness,
the first ceramic plate has a first through hole that passes therethrough in the direction of thickness,
the electrostatic attraction electrode is formed while avoiding the through hole,
the first organic insulating layer has a second through hole that passes therethrough in the direction of thickness and communicates with the first through hole, and
a third organic insulating layer is provided between the electrostatic attraction electrode and the through hole that surrounds the through hole.

10. The electrostatic chuck device according to claim 1, wherein the first organic insulating layer has a withstand voltage of 5 kV or more.

11. The electrostatic chuck device according to claim 1, wherein the electrostatic attraction electrode is smaller than the first organic insulating layer when viewed from above.

12. The electrostatic chuck device according to claim 1, wherein the first organic insulating layer is controlled so that the heat transfer rate between the first ceramic plate and the electrostatic attraction electrode is greater than $750 \text{ W/m}^2\text{K}$.

13. The electrostatic chuck device according to claim 1, further comprising: a second ceramic plate provided between the first organic insulating layer and the electrostatic attraction electrode or on the electrostatic attraction electrode on the opposite side from the first organic insulating layer.

14. The electrostatic chuck device according to claim 13, further comprising:

a second organic insulating layer provided between the temperature regulating base and the electrostatic attraction electrode.

15. The electrostatic chuck device according to claim 13, wherein
the first organic insulating layer, the second ceramic plate and the electrostatic attraction electrode engage with an indentation formed by the first embankment and the second side.

16. The electrostatic chuck device according to claim 15, wherein the second ceramic plate is provided between the first organic insulating layer and the electrostatic attraction electrode.

17. The electrostatic chuck device according to claim 15, wherein the second ceramic plate is provided on the electrostatic attraction electrode on the opposite side from the first organic insulating layer.

18. The electrostatic chuck device according to claim 15, wherein the first organic insulating layer is sealed in a space surrounded by the first ceramic plate and the second ceramic plate.

19. The electrostatic chuck device according to claim 15, wherein a through hole is provided that passes through the entire electrostatic chuck device in the direction of thickness,
the first ceramic plate has a first through hole that passes therethrough in the direction of thickness,
the electrostatic attraction electrode is formed while avoiding the through hole,
the first organic insulating layer has a second through hole that passes therethrough in the direction of thickness and communicates with the first through hole,
the second ceramic plate has a third through hole that passes therethrough in the direction of thickness and communicates with the first through hole and the second through hole, and
the first ceramic plate further has a second embankment that surrounds the periphery of the first through hole and is inserted into the second through hole and the third through hole.

20. The electrostatic chuck device according to claim 13, wherein the first organic insulating layer has a withstand voltage of 5 kV or more.

21. The electrostatic chuck device according to claim 13, wherein the electrostatic attraction electrode is smaller than the first organic insulating layer when viewed from above.

22. The electrostatic chuck device according to claim 1, wherein the first ceramic plate is composed of an aluminum oxide-silicon carbide composite sintered body, an aluminum oxide sintered body, an aluminum nitride sintered body or a yttrium oxide sintered body.

23. The electrostatic chuck device according to claim 13, wherein the second ceramic plate is composed of an aluminum oxide-silicon carbide composite sintered body, an aluminum oxide sintered body, an aluminum nitride sintered body or a yttrium oxide sintered body.

24. The electrostatic chuck device according to claim 1, wherein the thickness of the first ceramic plate is 0.3 mm or more and 1.0 mm or less.

* * * * *